United States Patent
Jain

(10) Patent No.: US 10,490,448 B2
(45) Date of Patent: Nov. 26, 2019

(54) METHOD OF USING A SACRIFICIAL CONDUCTIVE STACK TO PREVENT CORROSION

(71) Applicant: Texas Instruments Incorporated, Dallas, TX (US)

(72) Inventor: Manoj K. Jain, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/858,145

(22) Filed: Dec. 29, 2017

(65) Prior Publication Data
US 2019/0206730 A1    Jul. 4, 2019

(51) Int. Cl.
| H01L 21/768 | (2006.01) |
| H01L 23/532 | (2006.01) |
| H01L 23/00 | (2006.01) |
| H01L 21/3213 | (2006.01) |

(52) U.S. Cl.
CPC .. *H01L 21/76847* (2013.01); *H01L 21/32133* (2013.01); *H01L 21/76846* (2013.01); *H01L 23/53238* (2013.01); *H01L 24/05* (2013.01); *H01L 2224/05073* (2013.01); *H01L 2224/05147* (2013.01)

(58) Field of Classification Search
CPC combination set(s) only.
See application file for complete search history.

(56) References Cited

U.S. PATENT DOCUMENTS

| 7,026,225 | B1* | 4/2006 | Hau-Riege | H01L 21/76838 257/E21.582 |
| 7,585,759 | B2* | 9/2009 | Kuechenmeister | H01L 24/11 216/13 |
| 7,759,768 | B2* | 7/2010 | Barth | H01L 23/5223 257/528 |
| 9,508,666 | B2* | 11/2016 | Yu | H01L 23/147 |
| 2003/0155408 | A1* | 8/2003 | Fanti | H01L 21/2885 228/215 |
| 2005/0224987 | A1* | 10/2005 | Hortaleza | H01L 24/03 257/765 |
| 2006/0016861 | A1* | 1/2006 | Daubenspeck | B23K 3/0623 228/180.21 |

(Continued)

OTHER PUBLICATIONS

Patent Cooperation Treaty Search Report, dated Apr. 18, 2019, International Application No. PCT/US2018/068109.

*Primary Examiner* — Mamadou L Diallo
(74) *Attorney, Agent, or Firm* — Jacqueline J. Garner; Charles A. Brill; Frank D. Cimino

(57) ABSTRACT

A method of fabricating an integrated circuit (IC) chip is disclosed. The method starts with opening a window on a first surface of the IC chip through a passivation overcoat to expose the copper metallization layer. The window has sidewalls and a bottom that is adjacent the copper metallization layer. The method continues with depositing a barrier conductive stack on the passivation overcoat and exposed portions of the copper metallization layer, then depositing a sacrificial conductive stack on the barrier conductive stack. The sacrificial conductive stack has a thickness between 50 Å and 500 Å. The first surface of the semiconductor chip is polished to remove the sacrificial conductive stack and the barrier conductive stack from the surface of the passivation overcoat.

20 Claims, 7 Drawing Sheets

(56) References Cited

U.S. PATENT DOCUMENTS

| | | |
|---|---|---|
| 2008/0050905 A1 | 2/2008 | Uchida et al. |
| 2010/0155949 A1* | 6/2010 | Jain .................. H01L 21/76838 |
| | | 257/751 |
| 2014/0264861 A1 | 9/2014 | Hoinkis et al. |
| 2015/0179592 A1 | 6/2015 | Jain |

* cited by examiner

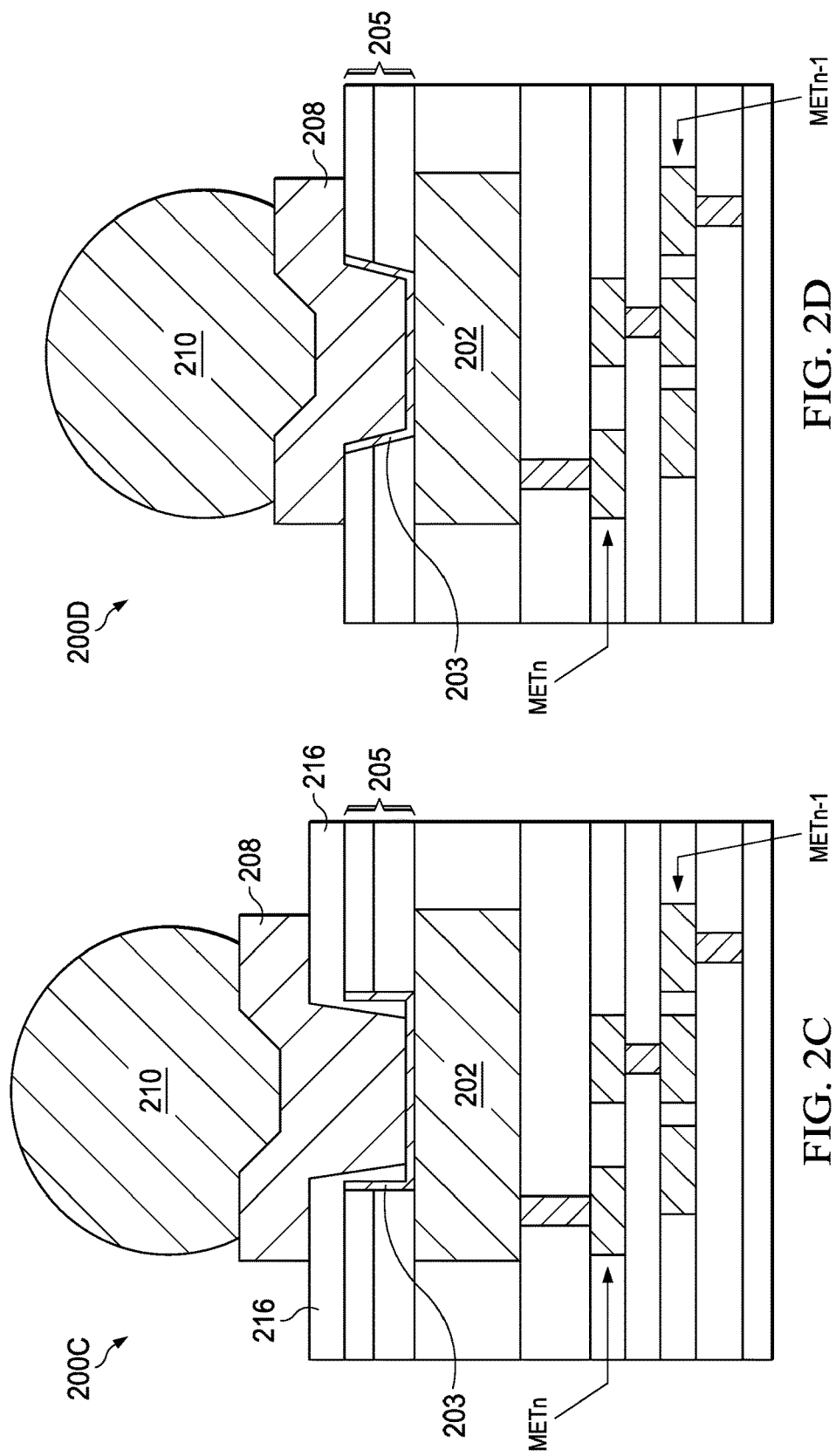

METHOD OF USING A SACRIFICIAL CONDUCTIVE STACK TO PREVENT CORROSION

FIELD OF THE DISCLOSURE

Disclosed embodiments relate generally to the field of preventing corrosion of copper connections. More particularly, and not by way of any limitation, the present disclosure is directed to a method of using a sacrificial conductive stack to prevent corrosion.

BACKGROUND

Currently, even when fabrication of a semiconductor wafer is completed, formation of a packaged integrated circuit (IC) chip can require multiple steps and take place in multiple locations. Because of the potential steps involved and the potential delays that can be experienced, any copper connections that might be exposed to the air must be protected to prevent corrosion. For at least some IC chips while still part of a wafer, probing of the wafer using the copper connections must also be performed while the corrosion prevention methods are in place. The processes currently in use for corrosion prevention and/or probing are costly for interconnect methods that utilize under-bump-metals or plated copper interconnects. Improvements are needed.

SUMMARY

Disclosed embodiments provide a method of using a sacrificial conductive stack to prevent corrosion of a copper connection on an IC chip. The method can also be utilized to allow probing of the chip, including thermal stressing of data written to memory, while protecting the integrity of the copper connection. After a window is opened to a copper connection, a barrier conductive stack is formed on the surface of the chip overlying the window. A sacrificial conductive stack is formed over the barrier conductive stack and is kept as thin as possible. Those portions of the barrier conductive stack and the sacrificial conductive stack that lie on the surface of the protective overcoat are removed by chemical-mechanical polishing. In this state, the wafers containing the IC chips with copper connections can be shipped, probed or thermally stressed without harming the copper connections. Prior to forming interconnections or an under-bump-metal, the sacrificial conductive stack is substantially removed from the window to expose the barrier conductive stack.

In one aspect, an embodiment of a method of utilizing a sacrificial conductive layer to prevent corrosion of copper metallization in an integrated circuit chip is disclosed. The method comprises opening a window on a first surface of the IC chip through a passivation overcoat to expose the copper metallization layer, the window having sidewalls and a bottom that is adjacent the copper metallization layer; depositing a barrier conductive stack on the passivation overcoat and exposed portions of the copper metallization layer; depositing a sacrificial conductive stack on the barrier conductive stack, the sacrificial conductive stack having a thickness between 50 Å and 500 Å; and polishing the first surface of the semiconductor chip to remove the sacrificial conductive stack and the barrier conductive stack from the surface of the passivation overcoat.

In another aspect, an embodiment of a method of forming interconnections over a copper metallization layer is disclosed. The method comprises receiving a semiconductor chip that comprises a window through a protective overcoat to the copper metallization layer, the window having a barrier conductive stack adjacent the copper metallization layer and the protective overcoat and a sacrificial conductive stack adjacent the barrier conductive stack; and performing an etching process to remove the sacrificial conductive stack.

In yet another aspect, an embodiment of an integrated circuit (IC) chip is disclosed. The IC chip comprises a copper metallization layer; a passivation overcoat overlying the copper metallization layer; a window through the passivation overcoat that exposes the copper metallization layer, the window having sidewalls and a bottom that is adjacent the copper metallization layer; a barrier conductive stack lining the sidewalls and the bottom of the window and contacting the copper metallization layer; and a further metallization layer coupled to the copper metallization layer through the barrier conductive layer.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIGS. 2A-2G each depict a portion of an IC chip having a type of interconnect or under-bump-metallization formed according to an embodiment of the disclosure;

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

As semiconductor chips and their packaging continues to evolve, numerous methods of interconnecting multiple chips in order to shorten the interconnections have evolved. It is not uncommon for the formation of a packaged chip to take place in multiple locations. For example, a wafer containing a few to several thousand chips can be fabricated at a first location. In some instances, fabrication can include writing specific information to a non-volatile memory on the chip, which then requires a probe of each chip to determine whether the information was correctly stored, thermal stressing of the wafer and a second probe of the chips to determine which chips failed under stress. The wafer may then be shipped to a second location where the chips can be separated and coupled to a lead frame or have a bump array or other forms of connectors formed.

The metallization layers in the fabrication facility (fab) can be either copper or aluminum. The copper metallization layers in the fabrication facility are generally formed using a Damascene process that etches trenches in a dielectric layer and fills the trench with copper. In contrast, metallization layers formed after a protective overcoat is provided on the chip, such as under-bump-metallization or interconnect layers, are generally formed either by depositing a layer of aluminum, then patterning and etching the aluminum, or else by patterning a photoresist layer on the top layer of the chip and plating copper on the surface exposed by the photoresist. The deposition of bump metal generally consists of depositing a barrier layer followed by copper plating. The present application refers to fab metallization as opposed to bump shop metallization to distinguish between these two different metallization processes and the points in time at which they occur. This reference to bump shop metallization is not intended to be limiting to under-bump metallization, but serves as an example only.

Figures 5, 6:
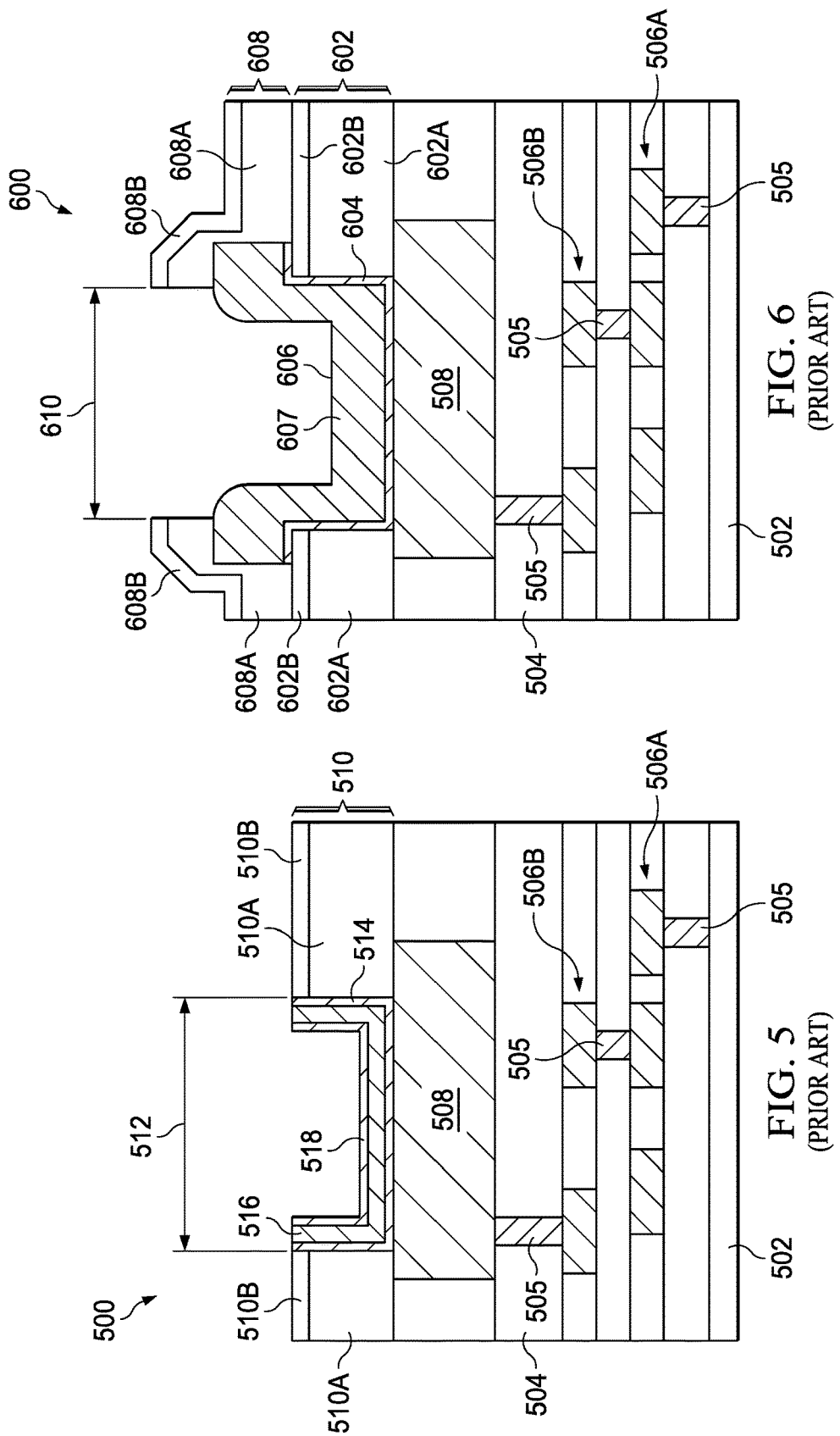
FIG. 5 depicts a wafer on which a copper metallization layer that will receive wire bonding has been protected from corrosion according to the prior art.
FIG. 6 depicts a wafer on which a copper metallization layer that will be sent to a bump shop for the formation of a bump array has been protected from corrosion according to the prior art.

When the final fab metallization layer is copper, the copper can be subjected to corroding effects, e.g., heat and humidity, in the time prior to bump-shop metallization being formed. Currently, chips can spend several weeks between completion of the chip itself and the further packaging that is necessary and may be shipped to other facilities, often overseas, so the copper must be protected from possible corrosion. FIG. 5 depicts a prior art wafer 500 in which a final fab metallization layer is copper. Wafer 500 includes a substrate 502 in which various devices (not specifically shown) such as transistors, resistors, capacitors, etc. are formed. An inter-level dielectric (ILD) 504 has been formed over the substrate and metallization layers have been formed to connect devices on the chip to each other. The metallization layers shown include metal N–1 506A, metal N 506B and copper metallization layer 508. Although three metallization layers are shown in this figure, the number of metallization layers can be fewer or greater than three as required by the design of the chip. The disclosed methodology is specific to copper in the final metallization layer 508, but the other metallization layers can be either aluminum or copper. Vias 505 provide connections between the different interconnect layers.

A protective overcoat 510 that is moisture impervious has been formed over the copper metallization layer 508 and ILD 504 for protection. In the embodiment shown, protective overcoat 510 has two layers: an oxide layer 510A, which can be silicon oxide, forms the layer directly over copper metallization layer 508 and a layer 510B formed over the oxide layer 510A can be either a nitride or an oxynitride. A window 512 has been opened in protective overcoat 510 to contact copper metallization layer 508. In order to protect copper metallization layer 508 from oxidation and to allow any necessary probing to be performed on wafer 500, a three-layer liner is formed in window 512. A layer of tantalum nitride (TaN) 514 is provided as a barrier layer, followed by a layer of nickel (Ni) 516. While these two layers provide a necessary barrier, they do not present a surface that is corrosion resistant and able to be probed. The final layer provided is palladium (Pd) 518, which can be used for probing and will not corrode at the temperatures to which the chip will be subjected. The palladium layer 518 is typically about 1500 Å thick. While the embodiment shown in FIG. 5 works well for chips that will receive wire bonding, this configuration will not work for other types of interconnects, such as bump arrays or other interconnection techniques. The problem with using this embodiment with further metallization is that the further metallization will not adhere to the palladium but will peel away.

FIG. 6 depicts a schematic diagram of a wafer 600 having a copper connection that is protected against corrosion and which can be utilized to form a bump array. In this figure, all elements below copper metallization layer 508 are the same as in FIG. 5, but the solution utilized for corrosion resistance and the ability to be probed are different. Again, a protective overcoat, which in this embodiment is a first protective overcoat 602 is formed over the top of the copper metallization layer 508 and ILD 504 and a window (not specifically indicated) has been formed through the protective overcoat 602 to expose copper metallization layer 508. A thin layer of tantalum nitride 604 is deposited over the surface of the protective overcoat 602 and the exposed copper metallization layer 508. The tantalum nitride 604 is followed by a layer of aluminum 606 that forms a cap over the copper metallization layer 508. This aluminum 606 is covered with a photoresist, which is patterned, and unnecessary portions of the aluminum 606 and TaN 604 are removed to form aluminum cap 607. Because the aluminum cap 607 is soft and subject to deformation, aluminum cap 607 is covered by a second protective overcoat 608, which again includes oxide layer 608A and oxynitride 608B. The second protective overcoat 608 is then patterned and etched to open a second window 610 to expose the aluminum cap 607.

The aluminum cap 607 serves well to protect copper metallization layer 508 from corrosion and to allow probing where necessary. When the wafer containing the aluminum cap 607 is received at a bump shop, the wafer can be cleaned, generally with a short sputter etching process, and the bump array can be formed according to known techniques. The entire process is well known and understood. However, because of the need for two masks to implement the aluminum cap, this process is expensive to utilize.

Applicants have determined that the protection process that is in use for wire bonding applications, while not being applicable for applications such as forming bump arrays, can be adapted for use with bump arrays and other connectors by thinning the final, corrosion-resistant layer to a point where the wafer cleaning process utilized at the bump shop can remove this layer, either completely or substantially. That is, rather than becoming a permanent part of the circuit being fabricated, the outer layer of the protective metal layers becomes a sacrificial layer.

In order to be clear, Applicant notes that for the purposes of this application, reference to a sacrificial layer or, as also referred to, a sacrificial conductive stack is intended to cover both a conductive layer or layers that are completely sacrificial, i.e., is entirely removed during processing, and also to cover a conductive layer or layers that are substantially removed but may leave remnants or tags of material in difficult to remove locations. This latter situation can arise, for example, when a sputter etching process is utilized to remove the conductive stack from a recess, such as the opening to a metallization layer. Because of the directionality of the etching process, the etch can successfully remove portions of the sacrificial conductive stack that are on the bottom of the opening, but leave portions of the conductive stack that are adjacent the sidewalls and/or corners of the opening. These remnants, when present, do not interfere with the creation of bumps or other connectors. In contrast, when a wet etching process is utilized to remove the sacrificial conductive stack, the etching process can generally remove the sacrificial conductive stack entirely.

Figure 1:
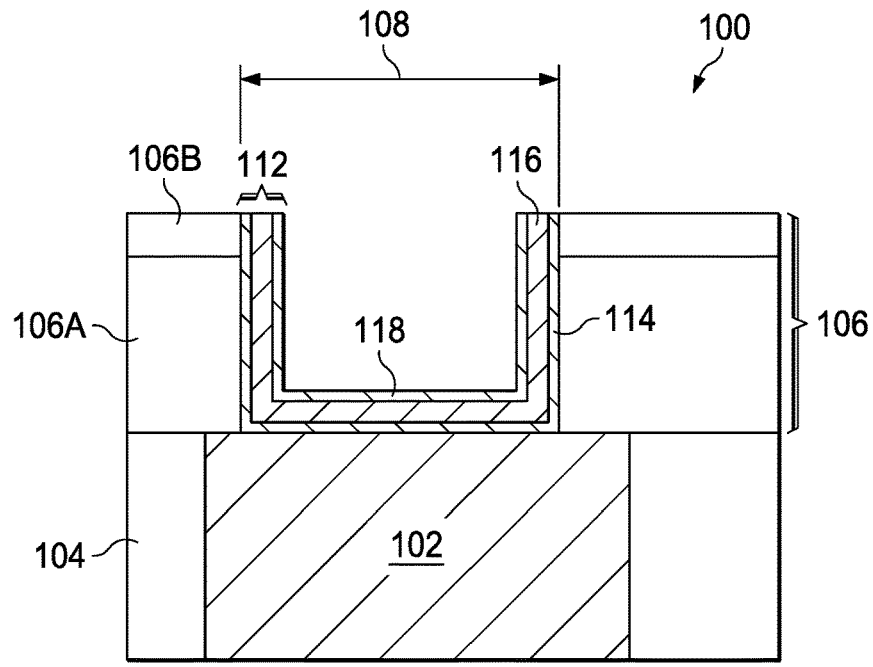
FIG. 1 depicts an example of a wafer on which a copper metallization layer is protected by a sacrificial conductive stack to prevent corrosion according to an embodiment of the disclosure.

FIG. 1 depicts an example of a wafer 100 containing IC chips on which a copper metallization layer is protected by a conductive stack to prevent corrosion, the conductive stack being partially sacrificial. In this figure, only a tiny fraction of an IC chip containing the final copper metallization layer 102 is shown, although it will be understood that can be any number of other metallization layers below copper metallization layer 102. Copper metallization layer 102 is surrounded by inter level dielectric 104 and has been covered with protective overcoat 106. In one embodiment, protective overcoat 106 includes oxide layer 106A, which can be silicon oxide, and oxynitride layer 106B. A layer of nitride (not specifically shown) can be utilized with or instead of oxynitride 106B.

After a window 108 is opened through the protective overcoat 106 to contact copper metallization layer 102, two conductive stacks are deposited on the surface of wafer 100 to provide the necessary corrosion protection. The stacks serve two somewhat different purposes and each contains one or more layers of conductive material.

The first stack is a barrier conductive stack 112, which acts to provide a barrier between the copper metallization layer 102 and further layers. In one embodiment, barrier conductive stack 112 comprises a layer of Ta or TaN 114 deposited to a thickness in the range of 100 Å-800 Å and the Ni 116 is deposited to a thickness in the range of 2000 Å-30,000 Å. Another embodiment of the barrier conductive stack 112 can include a layer of TaN followed by a layer of Ni and a further layer of TaN. In another embodiment, a layer of TaN can be followed with a layer of tungsten (W), with or without a further layer of tantalum nitride.

The second stack is a sacrificial conductive stack 118 that prevents oxidation of the barrier conductive stack and can also be utilized for probing of the wafer where necessary. Sacrificial conductive stack 118 can be a single layer, as shown in FIG. 1. Suitable materials for sacrificial conductive stack 118 include, e.g., noble metals such as gold, platinum, palladium, and ruthenium, as well as any combination of these metals. Other conductive materials that are suitable for sacrificial conductive stack 118 include metals that do not significantly oxidize at or below 260° C., e.g., chromium. In one embodiment, sacrificial conductive stack 118 has a thickness in the range of 50-500 Å. In one embodiment, sacrificial conductive stack 118 has a thickness in the range of 50-400 Å. In another embodiment, sacrificial conductive stack 118 has a thickness in the range of 50-250 Å. In yet another embodiment, sacrificial conductive stack 118 has a thickness in the range of 50-100 Å. Although shown as a single layer, sacrificial conductive stack 118 can include multiple sacrificial layers, e.g., platinum overlain with gold. It is desirable to keep the sacrificial conductive stack 118 as thin as possible so that the cleaning process normally employed at a bump shop can remove the sacrificial conductive stack 118 with little or no additional time being necessary when compared to a normal cleaning process for a wafer.

Although the disclosed process was designed for use with bump arrays on a wafer or chip, this process is not limited to bump arrays formed using a specific method or even to bump arrays. FIGS. 2A-2G each depicts an IC chip 200 having a connection method that can utilize the disclosed sacrificial conductive stack to provide these connectors in a cost effective manner. Each of these examples utilizes the same basic wafer shown in FIGS. 1, 5 and 6, but in each example, slightly different connectors are utilized or are tied to the copper metallization layer 202 in different ways.

Figure 2B:
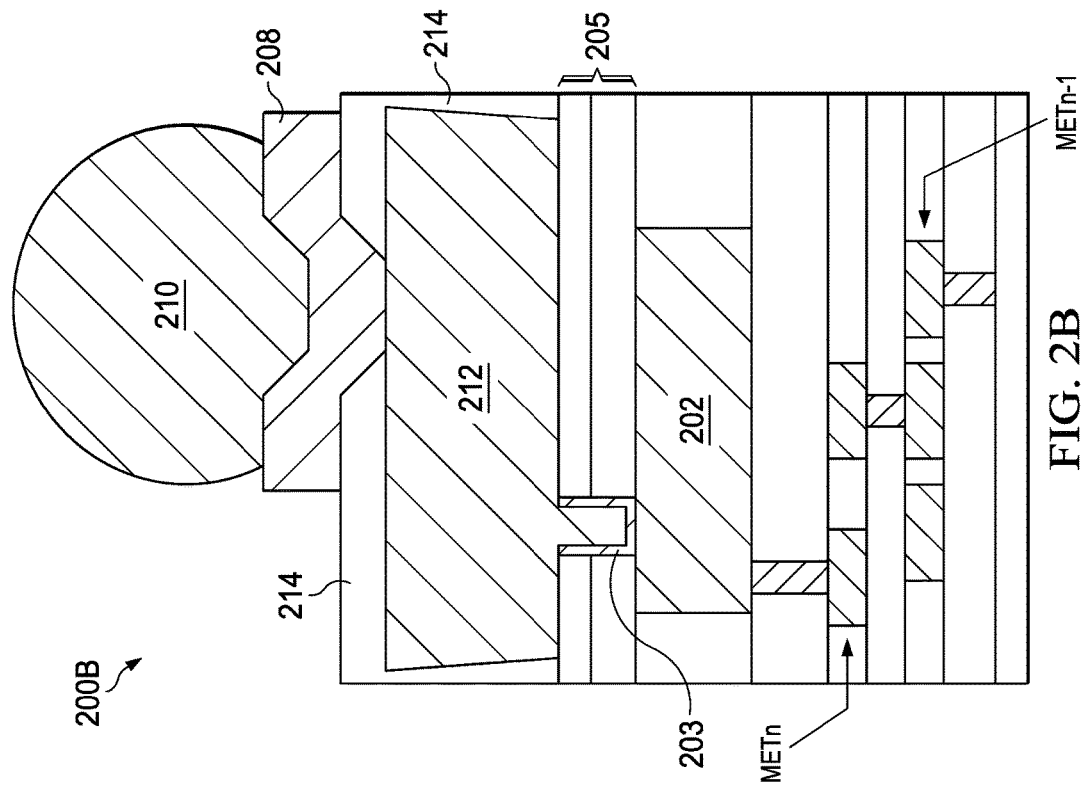
Figure 2A:
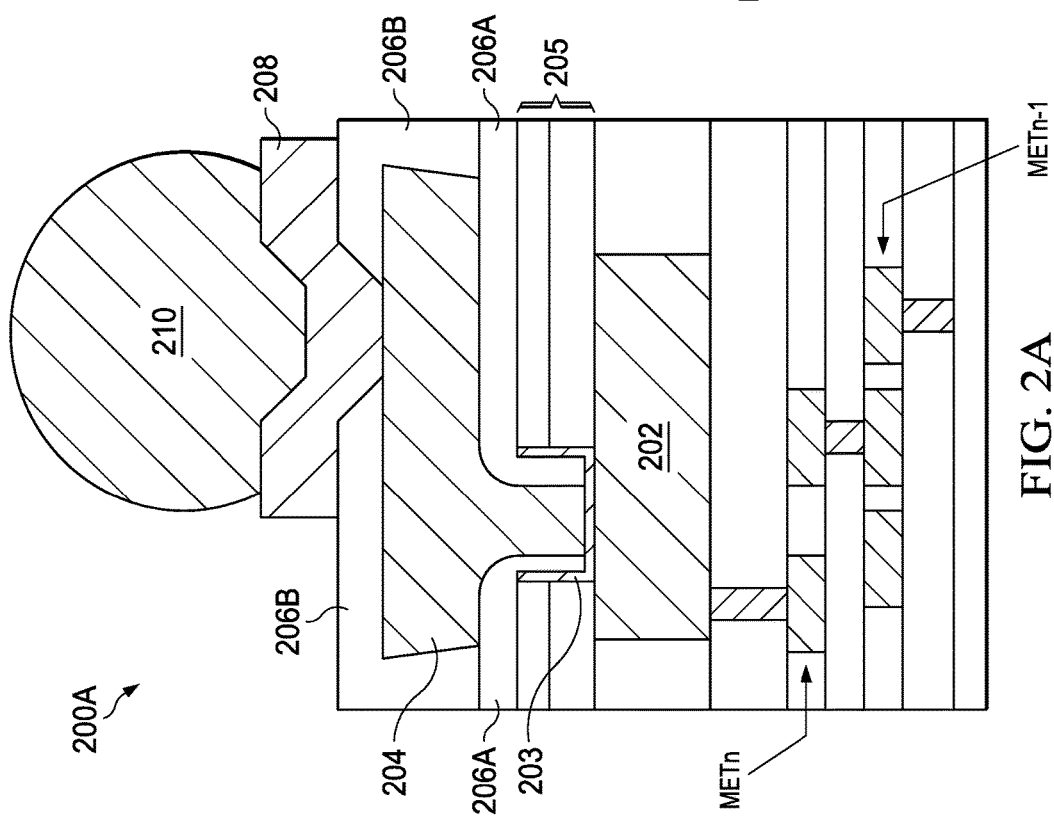

FIGS. 2A-2D each depicts an IC chip 200A-200D having a form of under-bump-metallization formed according to embodiments of the disclosure. In FIG. 2A, copper metallization layer 202 is coupled to a redistribution layer RDL 204 through the barrier conductive stack 203. A first polyimide layer 206A has been deposited over protective overcoat 205 prior to the formation of redistribution layer RDL 204 and a second polyimide layer 206B has been deposited on top of redistribution layer 204. Under-bump metal 208 has been formed in contact with the redistribution layer 204 and provides a landing area for solder bump 210.

In FIG. 2B, a copper interconnect layer 212 has been formed on top of protective overcoat 205 and contacts copper metallization layer 202 through barrier conductive stack 203, while polyimide 214 has been deposited on top of copper interconnect layer 212. Under-bump metal 208 has been formed on top of polyimide 214 and in contact with copper interconnect layer 212, with solder bump 210 formed on the under-bump metal 208. FIG. 2C depicts an embodiment in which under-bump metal 208 is separated from the protective overcoat 205 only by polyimide 216 and directly contacts barrier conductive stack 203 to couple to copper metallization layer 202. FIG. 2D depicts a further embodiment in which under-bump metal 208 has been formed on top of protective overcoat 205 and directly contacts barrier conductive stack 203 to couple to copper metallization 202. Other variations on these embodiments are also possible.

Figure 2F:
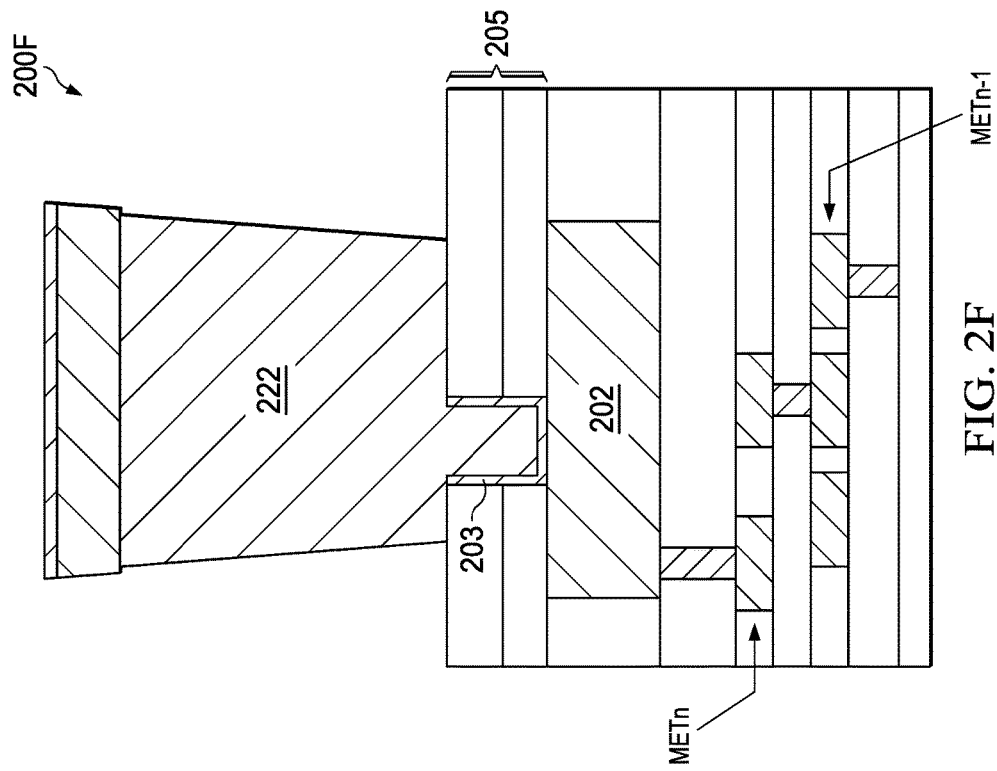
Figure 2E:
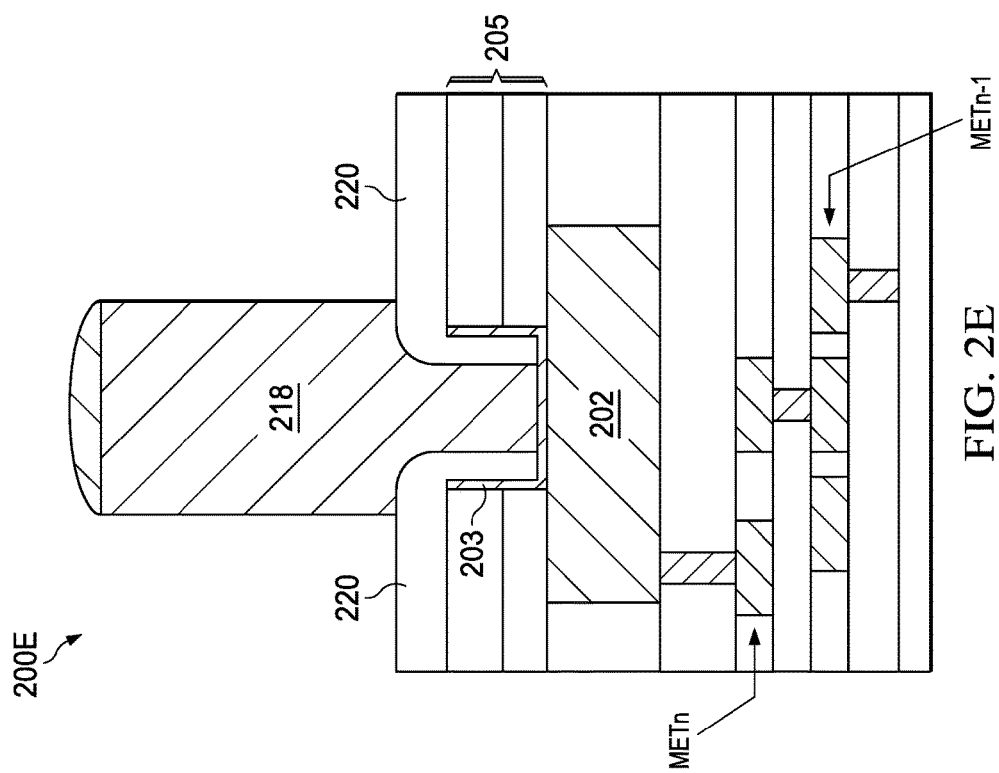
Figure 2G:
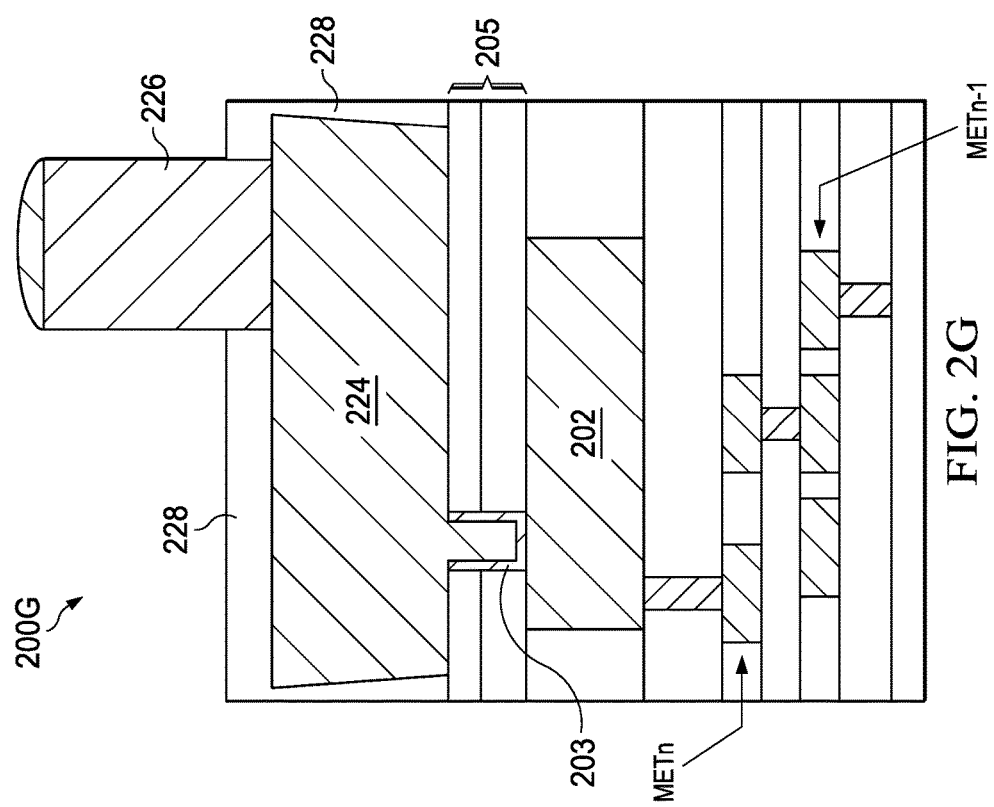

FIGS. 2E-2G depict other IC chips 200E-200G having means of providing couplings with a further chip. In FIG. 2E, a copper pillar 218 is coupled to copper metallization layer 202 through barrier conductive stack 203 and is also separated from protective overcoat 205 by polyimide 220. In FIG. 2F, the polyimide layer is omitted and a metal bonding layer METTOP 222 has been deposited directly overlying protective overcoat 205 and barrier conductive stack 203 to provide a coupling to copper metallization layer 202. FIG. 2G depicts an embodiment in which metal bonding layer METTOP 224 is deposited overlying protective overcoat 205 and barrier conductive stack 203, then etched, followed by deposition of polyimide 228. A copper post 226 provides a contact to metal bonding layer METTOP 203. These methods of coupling a chip to a printed circuit board or another chip are provided as examples of the methodologies in which the disclosed method of using a sacrificial conductive stack to prevent corrosion can be incorporated. Other methodologies can also utilize the disclosed process to provide corrosion protection with fewer process steps and less expense. It should be noted that while each of these examples depict only a barrier conductive stack 203 lining the window that was previously opened. It will be understood that in embodiments that utilize a sputter etching process, remnants of the sacrificial conductive stack (not specifically shown) can be present on the sidewalls of the previously opened window.

Figure 3:
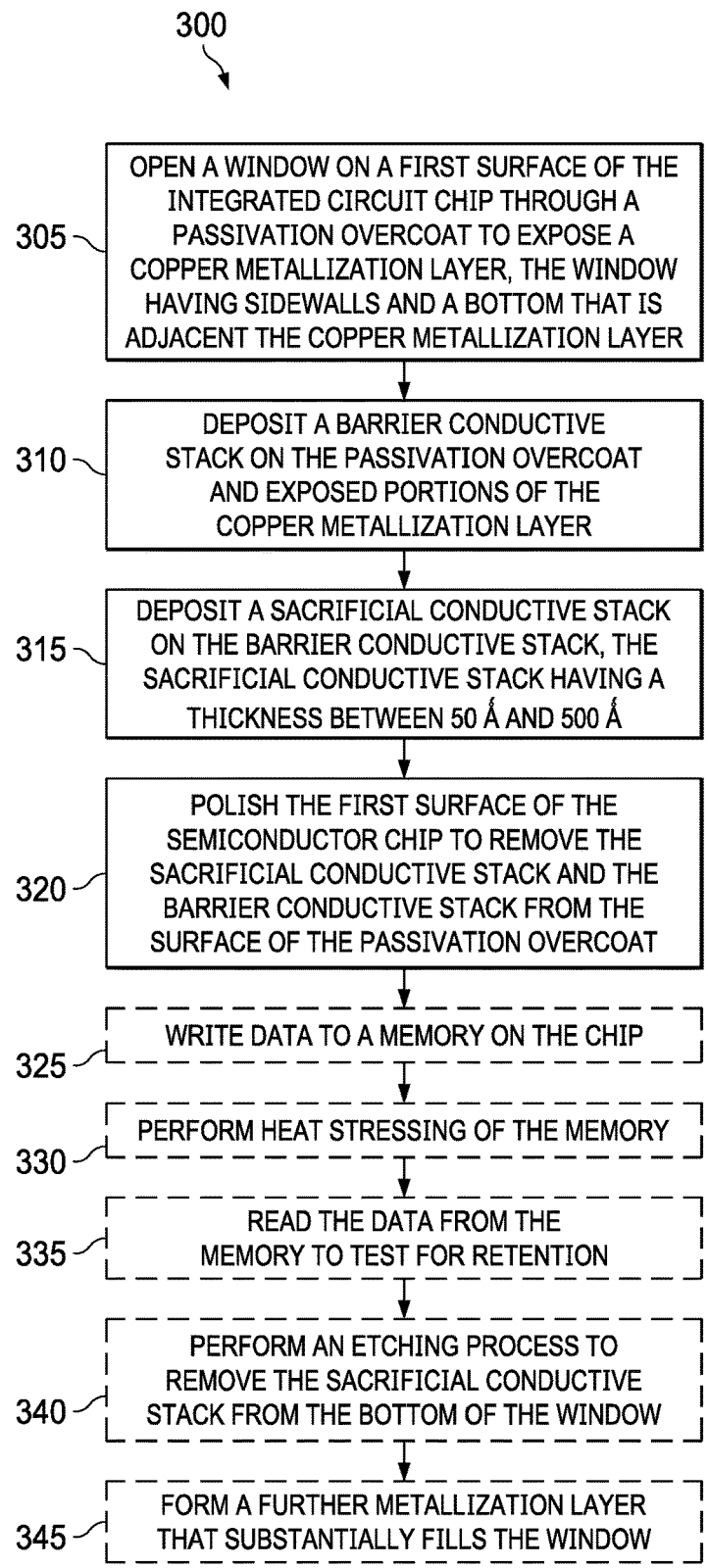
FIG. 3 depicts a method of forming a sacrificial conductive stack to prevent corrosion according to an embodiment of the disclosure.

FIG. 3 depicts a flowchart for a method 300 of utilizing a sacrificial conductive stack to prevent corrosion of a copper metallization layer according to an embodiment of the disclosure. When method 300 begins, active devices have already been formed on an IC chip, as well as metallization layers that couple devices on the chip with each other. A top metallization layer, which is of copper, has been covered with a passivation overcoat. A typical passivation may consist of oxynitride, silicon nitride, a combination of silicon dioxide and oxynitride, or a combination of silicon dioxide and silicon nitride. Method 300 starts with opening 305 a window on a first surface of the IC chip through the passivation overcoat to expose the copper metallization layer. We define the window as having sidewalls, which are adjacent the passivation overcoat, and a bottom that is adjacent the copper metallization layer.

Method 300 continues with depositing 310 a barrier conductive stack on the passivation overcoat and the exposed portions of the copper metallization layer. In one embodiment, the barrier conductive stack includes a layer of TaN with a layer of Ni on top of the TaN. A sacrificial conductive stack is then deposited 315 on the barrier conductive stack. The sacrificial conductive stack has a thickness between 50 Å and 500 Å. In one embodiment, the sacrificial conductive stack is formed of palladium. Finally, the first surface of the semiconductor chip is polished 320 to remove the sacrificial conductive stack and the barrier conductive stack from the surface of the passivation overcoat. In one embodiment, the copper metallization layer is the last metallization layer that is formed at the fabrication facility, with other metallization processes such as preparing the chip for coupling to a printed circuit board or to other chips being performed at other facilities.

In one embodiment, data is written 325 to memory that has been formed on the chip. This can be performed utilizing probes and the access to the copper metallization layer provided by the sacrificial conductive stack and the barrier conductive stack. Once the data is written, heat stressing can be performed 330 on the chip by a bake cycle. This is followed by reading 335 the data from the memory to test for retention. Memories that do not retain the data can be marked and will not be shipped to a customer. Each of elements 325, 330, 335 is shown within dotted lines to indicate that they are optional.

While preparing a chip for coupling to a printed circuit board or to other chips is generally performed at a different facility, some fabrication facilities can perform these tasks in house. In one embodiment, memory testing is followed with removal of the sacrificial conductive stack from the window that was previously created. In this embodiment, method 300 continues with performing an etching process 340 to remove the sacrificial conductive stack from at least the bottom of the window. If the etching process is a wet etch, the sacrificial conductive stack is also removed from the sides of the window, although this is not necessary to the process. In addition to removing the sacrificial conductive stack, the etching process also removes any contaminants that may have been introduced during reading of the memory. Finally, a further metallization layer is formed 345 that substantially fills the window. In at least one embodiment, the further metallization layer completely fills the window. In one embodiment, a dielectric layer, such as a polyimide layer is first deposited on the protective overcoat and a smaller window opened through the dielectric layer to contact the copper metallization layer. In this latter embodiment, the further metallization layer fills the smaller window and substantially fills the original window. The further metallization layer can be any of the processes shown in FIGS. 2A-2G or any other metallization process, whether currently known or unknown.

Figure 4:
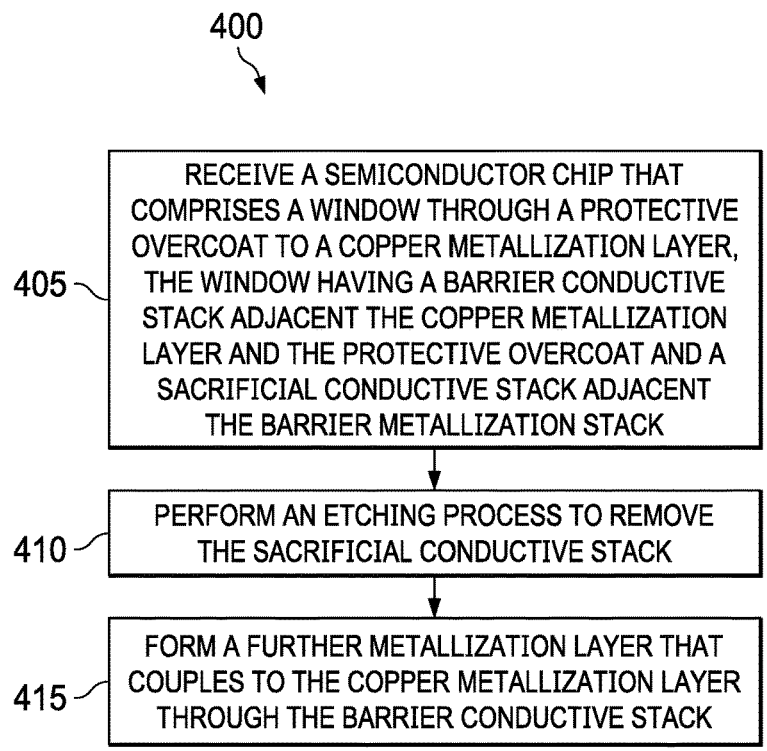
FIG. 4 depicts a method of forming interconnections over a copper metallization layer according to an embodiment of the disclosure.

FIG. 4 depicts a flowchart for a method 400 of forming interconnections over a copper metallization layer. This method would generally be performed at a bump facility or similar facility. Method 400 begins with receiving 405 a semiconductor chip that comprises a window through a protective overcoat to a copper metallization layer. When received, the window has a barrier conductive stack adjacent the copper metallization layer and the protective overcoat and a sacrificial conductive stack adjacent the barrier conductive stack. The facility performs 410 an etching process to remove the sacrificial conductive stack. Because the sacrificial conductive stack is formed to be as thin as possible, in one embodiment, the process does not require any additional time to remove the sacrificial conductive stack than would normally be allotted for the removal of contaminants. In one embodiment, additional time for removal of the sacrificial conductive stack is minimal. As previously noted, the etching process may remove only the portion of the sacrificial conductive stack that lies on the bottom of the window or the etching process may remove all portions of the sacrificial conductive stack. In either case, the etching process can be followed by forming 415 a further metallization layer that couples to the copper metallization layer through the barrier conductive stack. This process of forming the further metallization layer can utilize any method, whether currently known or unknown.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A method of fabricating an integrated circuit (IC) chip, the method comprising:
opening a window on a first surface of the IC chip through a passivation overcoat to expose the copper metallization layer, the window having sidewalls and a bottom that is adjacent the copper metallization layer;

depositing a barrier conductive stack on the passivation overcoat and exposed portions of the copper metallization layer;

depositing a sacrificial conductive stack on the barrier conductive stack, the sacrificial conductive stack having a thickness between 50 Å and 500 Å; and polishing the first surface of the semiconductor chip to remove the sacrificial conductive stack and the barrier conductive stack from the surface of the passivation overcoat.

2. The method as recited in claim 1 wherein the barrier conductive stack comprises a first layer of tantalum nitride.

3. The method as recited in claim 2 wherein the barrier conductive stack further comprises a layer of nickel.

4. The method as recited in claim 3 wherein the barrier conductive stack further comprises a second layer of tantalum nitride.

5. The method as recited in claim 2 wherein the barrier conductive stack further comprises a layer of tungsten.

6. The method as recited in claim 1 wherein the sacrificial conductive stack comprises any of palladium, platinum, gold, ruthenium or any combination thereof.

7. The method as recited in claim 1 further comprising performing an etching process to remove the sacrificial conductive stack from at least the bottom of the window.

8. The method as recited in claim 7 wherein performing the etching process comprises performing a wet etching process to remove the sacrificial conductive stack from the window.

9. The method as recited in claim 7 wherein performing the etching process comprises performing a sputter etching process to remove the sacrificial conductive stack from the bottom of the window.

10. The method as recited in claim 7 further comprising forming a further metallization layer that substantially fills the window.

11. An integrated circuit (IC) chip comprising:
a copper metallization layer;
a passivation overcoat overlying the copper metallization layer;
a window through the passivation overcoat that exposes the copper metallization layer, the window having sidewalls and a bottom that is adjacent the copper metallization layer;
a barrier conductive stack lining the sidewalls and the bottom of the window and contacting the copper metallization layer;
a further metallization layer coupled to the copper metallization layer through the barrier conductive layer; and
remnants of a sacrificial conductive stack lining the walls of the window between the barrier conductive stack and the passivation overcoat.

12. The method as recited in claim 10 wherein the further metallization layer is an under-bump metal layer.

13. The method as recited in claim 10 wherein the further metallization layer is a plated layer of copper.

14. A method of fabricating an integrated circuit, the method comprising:
receiving a semiconductor chip that comprises a window through a protective overcoat to a copper metallization layer, the window having a barrier conductive stack adjacent the copper metallization layer and the protective overcoat and a sacrificial conductive stack adjacent the barrier conductive stack; and
performing an etching process to remove the sacrificial conductive stack.

15. The method as recited in claim 14 wherein performing the etching process comprises performing a wet etching process that removes the entire sacrificial conductive stack.

16. The method as recited in claim 14 wherein performing the etching process comprises performing a sputter etching process that removes the sacrificial conductive stack from the surface of the window adjacent the copper metallization layer.

17. The method as recited in claim 14 further comprising forming a further metallization layer that couples to the copper metallization layer through the barrier conductive stack.

18. The method as recited in claim 17 wherein forming the further metallization layer comprises plating a copper interconnect layer.

19. The method as recited in claim 17 wherein forming the further metallization layer comprises depositing an under-bump-metal layer overlying the window.

20. The IC chip as recited in claim 11 wherein the copper metallization layer is formed in a trench formed in an inter-level dielectric layer and the further metallization layer is formed on a surface of a dielectric layer.

* * * * *